(12) United States Patent
Chang et al.

(10) Patent No.: US 9,281,165 B1
(45) Date of Patent: Mar. 8, 2016

(54) BIAS ELECTRODES FOR TANDEM ACCELERATOR

(71) Applicant: Varian Semiconductor Equipment Associates, Inc., Gloucester, MA (US)

(72) Inventors: Shengwu Chang, South Hamilton, MA (US); Christopher Lupoli, Exeter, NH (US); William Davis Lee, Newburyport, MA (US); Frank Sinclair, Boston, MA (US); James Pixley, Dover, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/469,050

(22) Filed: Aug. 26, 2014

(51) Int. Cl.
*H01J 49/00* (2006.01)
*H01J 37/30* (2006.01)
*H01J 37/317* (2006.01)
*H01J 37/05* (2006.01)
*H05H 5/06* (2006.01)

(52) U.S. Cl.
CPC ............. *H01J 37/3007* (2013.01); *H01J 37/05* (2013.01); *H01J 37/3171* (2013.01); *H05H 5/063* (2013.01); *H01J 2237/0473* (2013.01)

(58) Field of Classification Search
USPC ....................................................... 250/288
See application file for complete search history.

(56) References Cited

U.S. PATENT DOCUMENTS

| 5,120,956 | A  | * | 6/1992  | Purser ................... | H01J 49/086 250/281 |
| 6,653,642 | B2 | * | 11/2003 | Pedersen ............. | H01J 37/3171 250/492.1 |
| 7,498,588 | B1 |   | 3/2009  | Gordon et al. | |
| 8,664,619 | B2 | * | 3/2014  | Chang ................... | H01J 49/067 250/295 |
| 2006/0011866 | A1 | | 1/2006 | Cho | |
| 2006/0292058 | A1 | | 12/2006 | von Reden et al. | |
| 2011/0101213 | A1 | | 5/2011 | Satoh | |
| 2013/0112869 | A1 | | 5/2013 | Synal et al. | |

OTHER PUBLICATIONS

International Search Report and Written Opinion mailed Dec. 21, 2015 in corresponding PCT application No. PCT/US2015/045892.

* cited by examiner

*Primary Examiner* — Phillip A Johnston

(57) ABSTRACT

A tandem accelerator and ion implanter with improved performance is disclosed. The tandem accelerator includes a plurality of input electrodes, a plurality of output electrodes and a high voltage terminal disposed therebetween. The high voltage terminal includes a stripper tube. Neutral molecules are injected into the stripper tube, which remove electrons from the incoming negative ion beam. The resulting positive ions are accelerated toward the plurality of output electrodes. To reduce the amount of undesired positive ions that exit the stripper tube, bias electrodes is disposed at the entrance and exit of the stripper tube. The bias electrodes are biased a second voltage, greater than the first voltage applied to the terminal. The bias electrodes repel slow moving positive ions, preventing them from exiting the stripper tube and contaminating the workpiece.

17 Claims, 3 Drawing Sheets

BIAS ELECTRODES FOR TANDEM ACCELERATOR

FIELD

Embodiments of this disclosure are directed to a tandem accelerator, and an ion implantation system using the tandem accelerator.

BACKGROUND

Tandem accelerators are used to accelerate ions toward a target, often a semiconductor workpiece. A tandem accelerator is so named because it accelerates an ion beam two times. The tandem accelerator includes a plurality of input electrodes biased at progressively more positive voltages and a plurality of output electrodes biased at progressively less positive voltages, with a positively biased terminal disposed between these two pluralities of electrodes.

To create an accelerated ion beam, a negative ion beam is accelerated toward the positive terminal. This negative ion beam is stripped of electrons in the terminal to become a positive ion beam. The positive ion beam is then accelerated away from the positive terminal toward the less positive output electrodes.

To strip the negative ion beam of its electrons, the negative ion beam enters a stripper tube. Neutral molecules are also fed into the stripper tube. As the negative ions pass through the neutral molecules, electrons are stripped from the negative ions, transforming them into positive ions. These positive ions are then attracted from the positive terminal toward the more negative output electrodes.

Ideally, only positive ions that were created from the original negative ions pass through the tandem accelerators. However, in some cases, other ions, such as positive ions from the neutral molecules, also pass through the tandem accelerator. These undesired ions may contaminate the workpiece and decrease the yield of the implanting process.

Therefore, it would be beneficial if there were an improved tandem accelerator for creating high energy ion beams without introducing unwanted ions.

SUMMARY

A tandem accelerator and ion implanter with improved performance is disclosed. The tandem accelerator includes a plurality of input electrodes, a plurality of output electrodes and a high voltage terminal disposed therebetween. The high voltage terminal includes a stripper tube. Neutral molecules are injected into the stripper tube, which remove electrons from an incoming negative ion beam. The resulting positive ions are accelerated toward the plurality of output electrodes. To reduce the amount of undesired positive ions that exit the stripper tube, bias electrodes is disposed at the inlet and outlet of the stripper tube. The bias electrodes are biased a second voltage, greater than the first voltage applied to the terminal. The bias electrodes repel slow moving positive ions, preventing them from exiting the stripper tube and contaminating the workpiece and the output electrodes.

In one embodiment, a tandem accelerator is disclosed. The tandem accelerator comprises a plurality of input electrodes; a plurality of output electrodes; a terminal, disposed between an innermost electrode of the plurality of input electrodes and an innermost electrode of the plurality of output electrodes, the terminal biased at a first voltage; a stripper tube disposed in the terminal, having an inlet proximate the plurality of input electrodes, an outlet proximate the plurality of output electrodes, and an injection conduit for introduction of a stripper gas; and a first bias electrode disposed between the outlet of the stripper tube and the innermost electrode of the plurality of output electrodes, the first bias electrode biased at a second voltage, more positive than the first voltage.

In another embodiment, a tandem accelerator is disclosed. The tandem accelerator comprises a plurality of input electrodes; a plurality of output electrodes; a terminal, disposed between an innermost electrode of the plurality of input electrodes and an innermost electrode of the plurality of output electrodes, the terminal biased at a first voltage; and a stripper tube disposed in the terminal, having an inlet proximate the plurality of input electrodes, an outlet proximate the plurality of output electrodes, and an injection conduit for introduction of a stripper gas; wherein the innermost electrode of the plurality of output electrodes is biased at a second voltage, more positive than the first voltage.

In another embodiment, an ion implantation system is disclosed. The ion implantation system comprises a negative ion beam source; and a tandem accelerator which converts a negative ion beam from the negative ion beam source into a positive ion beam, the tandem accelerator comprising a plurality of input electrodes; a plurality of output electrodes; a terminal, disposed between an innermost electrode of the plurality of input electrodes and an innermost electrode of the plurality of output electrodes, the terminal biased at a first voltage; a stripper tube disposed in the terminal, having an inlet proximate the plurality of input electrodes, an outlet proximate the plurality of output electrodes, and an injection conduit for introduction of a stripper gas; and a first bias electrode disposed between the outlet of the stripper tube and the innermost electrode of the plurality of output electrodes, the first bias electrode biased at a second voltage, more positive than the first voltage.

BRIEF DESCRIPTION OF THE FIGURES

For a better understanding of the present disclosure, reference is made to the accompanying drawings, which are incorporated herein by reference and in which.

DETAILED DESCRIPTION

An improved tandem accelerator and an ion implantation system using the improved tandem accelerator are disclosed. The improved tandem accelerator inhibits or reduces the passage of undesired positive ions from the stripper tube. A bias electrode is disposed between the outlet of the stripper tube and the plurality of output electrodes. The positively biased electrode inhibits or reduces the passage of slow moving positive ions without affecting the passage of high speed ions, creating less contamination in the workpiece.

Figure 1:
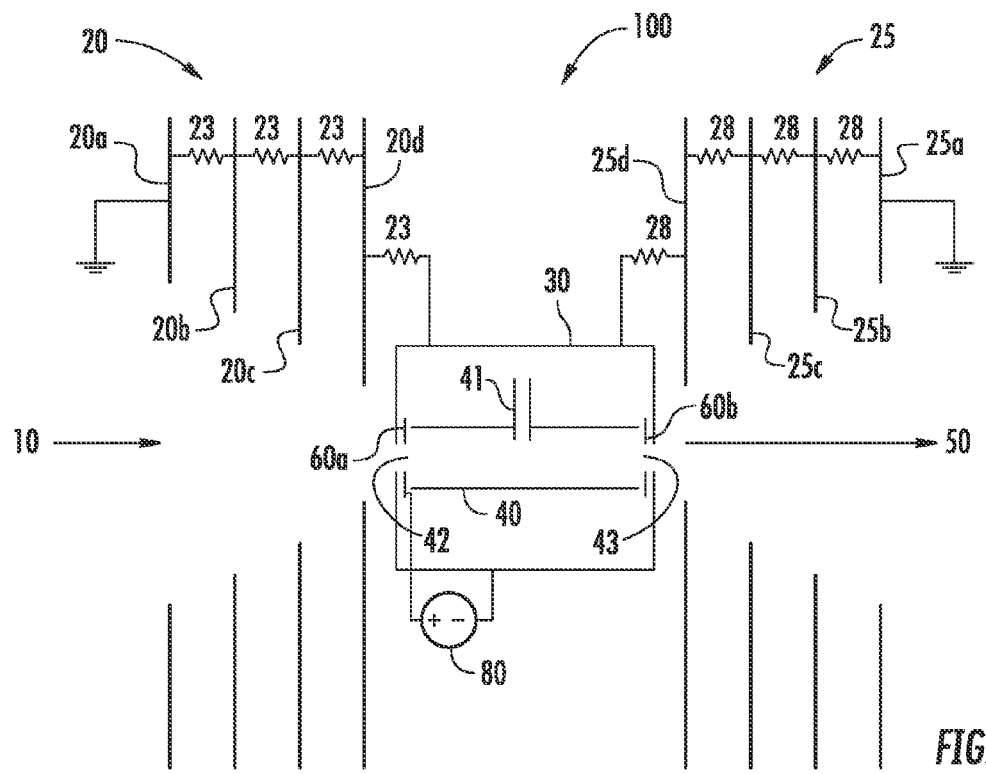
FIG. 1 shows a first embodiment of a tandem accelerator.

FIG. 1 shows a first embodiment of the tandem accelerator 100. The tandem accelerator 100 comprises a plurality of input electrodes 20. These input electrodes 20 may be any suitable electrically conductive material, such as titanium or other metals. Each of the input electrodes 20 is biased at an increasingly more positive voltage. The outermost input electrode 20a may be grounded. Each of the subsequent input electrodes (i.e. second input electrode 20b, third input electrode 20c, and innermost input electrode 20d) is connected to the previous input electrode through a resistor 23, such as one having a resistance in excess of 1 MΩ. Of course, the number of input electrodes 20 is not limited to 4, or any other particular number. In some embodiments, the number of input electrodes 20 may be twenty or more.

The innermost input electrode 20d, which is closest to the terminal 30, may also be connected to the terminal 30 through a resistor 23. If all of the resistors 23 are of an equal value, then the voltage of each input electrode 20 is of increasing magnitude, where the increase in voltage between adjacent input electrodes 20 is a constant. For example, if the terminal 30 is biased to a first voltage, such as 4 MV, and four input electrodes 20 are used, the voltage of outermost input electrode 20a is 0V. The second input electrode 20b is biased at 1 MV, the third input electrode 20c is biased at 2 MV. The innermost input electrode 20d is biased at 3 MV. Furthermore, while the above example assumes that the values of all resistors 23 are the same, the disclosure is not limited to this embodiment. The resistors 23 may each have a different value, or may have the same values. Furthermore, while the above example discloses a first voltage of 4 MV, other voltages may be used and the disclosure is not limited to any particular value.

In some embodiments, the size of the aperture in each of input electrodes 20 varies. In some embodiments, the aperture becomes progressively smaller in each input electrode 20 leading to the terminal 30. For example, the outermost input electrode 20a may have the widest aperture, while the innermost input electrode 20d may have the smallest aperture. The apertures of the input electrodes between the outermost input electrode 20a and the innermost input electrode 20d (i.e. the second input electrode 20b and the third input electrode 20c) may be progressively smaller.

The apertures of the input electrodes 20 lead to a stripper tube 40 disposed within the terminal 30. The terminal 30 and the stripper tube 40 are biased positively relative to the outermost input electrode 20a. In some embodiments, the terminal 30 and stripper tube 40 are positively biased relative to all of the input electrodes 20. For example, the outermost input electrode 20a may be grounded while the terminal 30 is biased to a first voltage, which may be, for example, several million volts. The stripper tube 40 may be biased at the same voltage as the terminal 30. In other words, the stripper tube 40 is also biased at the first voltage. The stripper tube 40 also includes an injection conduit 41 where a stripper gas is injected. The stripper gas may comprise neutral molecules. These neutral molecules may be any suitable species such as, but not limited to argon and nitrogen. The stripper tube 40 has an inlet 42 disposed on the same side as the plurality of input electrodes 20. The outlet 43 of the stripper tube 40 is in communication with the plurality of output electrodes 25.

The plurality of output electrodes 25 may be a mirror image of the input electrodes 20, in which the apertures in the output electrodes 25 grow larger moving away from the terminal 30. For example, the innermost output electrode 25d may have the smallest aperture. The apertures of the adjacent output electrodes (i.e. second output electrode 25c, and third output electrode 25b) may grow progressively larger, while the outermost output electrode 25a has the largest aperture. These output electrodes 25 may be any suitable electrically conductive material, such as titanium or other metals.

The output electrodes 25 may also be electrically connected through a series of resistors 28. As described above, the innermost output electrode 25d may be connected to the terminal 30 through a resistor 28. Each adjacent output electrode 25 may be connected to the previous output electrode 25 via a resistor. The outermost output electrode 25a may be grounded. In this way, each output electrode 25 becomes progressively less positive moving away from the terminal 30.

In some embodiments, the tandem accelerator 100 may be housed within a housing (not shown), which may be made from steel. Insulators (not shown), which may be glass, may be disposed between each of the electrodes to prevent arcing between electrodes. The insulators may also serve to allow a vacuum to be created in the region of the tandem accelerator where the ion beams pass. An insulating gas, such as $SF_6$, may also be disposed in the housing.

Disposed within the terminal 30 are bias electrodes 60a, 60b. These bias electrodes 60a, 60b are disposed proximate the inlet 42 and the outlet 43 of the stripper tube 40, respectively. These bias electrodes 60a, 60b are positively biased relative to the terminal 30, such as by power supply 80. In other words, the bias electrodes 60a, 60b may be biased at a second voltage, which is greater (i.e. more positive) than the first voltage at which the terminal 30 is biased. In some embodiments, the second voltage may be about 100-2000 volts greater than the first voltage, although other values may be used. In some embodiments, the power supply 80 is referenced to the terminal 30.

The tandem accelerator 100 operates as follows. A negative ion beam 10 of the desired species is created. This negative ion beam 10 may be generated in a number of ways. In one embodiment, a positive ion beam may be created in the traditional manner, such as using a Bernas or IHC ion source. The positive ion beam exiting the ion source may be coupled to a Mg charge exchange cell, which transforms the positive ion beam into the negative ion beam 10. Of course, other mechanisms for the generation of a negative ion beam 10 are known in the art. The mechanism used to create the negative ion beam 10 is not limited by this disclosure.

The negative ion beam 10 of desired species is directed toward the tandem accelerator 100. The negative ion beam 10 is attracted into the tandem accelerator 100, and toward the terminal 30, which is positively biased.

As the negative ion beam 10 passes through the apertures in the input electrodes 20, the negative ions gain speed, as the input electrodes 20 become progressively more positively biased.

These very fast moving negative ions enter the inlet 42 of the stripper tube 40, where they collide with neutral molecules disposed therein. These neutral molecules tend to strip electrons from the negative ion beam 10, creating positive ions of the desired species.

These positive ions of the desired species are then drawn out of the outlet 43 of the stripper tube 40 by the output electrodes 25, which are biased with progressively less positive voltages, to form a positive ion beam 50. Thus, ions are accelerated twice; first as a negative ion beam 10 passing through the input electrodes 20 and then as a positive ion beam 50 passing through the output electrodes 25.

Ideally, only the desired species that formed the negative ion beam 10 are transformed into positive ions and accelerated through the output electrodes 25. However, other species may also be transformed into positive ions and accelerated through the output electrodes 25.

For example, in some embodiments, the neutral molecules in the stripper gas become positively charged and get accelerated through the output electrodes 25. For example, the stripper gas may be argon. When the negative ion beam 10 collides with the argon molecules, undesired argon ions, such as Ar+, may be formed. Additionally, in some embodiments, molecules of the insulating gas may be leaked into the stripper tube 40 and become positively charged via collisions with the negative ion beam 10 and accelerated through the output electrodes 25. If the insulating gas is $SF_6$, additional undesired ions may be $S^+$ and $F^+$. Additionally, if the stripper tube 40 is graphite, undesired $C^+$ ions may be produced in the stripper tube 40 from primary ion beam sputtering. These undesired positive ions may be created in the stripper tube 40 and may be extracted by the output electrodes 25 as part of the positive ion beam 50. These other species are undesirable and may impact implant quality and yield. In addition, in some instances, these undesirable species impact or strike the output electrodes 25, causing contamination of the output electrodes 25.

These undesirable positive ions are typically much slower moving than the faster moving ions of the desired species. Thus, it is possible to contain these undesirable positive ions in the stripper tube 40 through the use of bias electrodes 60a, 60b. As described above, these bias electrodes 60a, 60b are positively biased relative to the terminal 30 and the stripper tube 40. Thus, they tend to repel slow moving positive ions from the stripper tube 40 back into the stripper tube 40. The bias electrodes 60a, 60b are electrically conductive, and may be graphite or other metals.

However, the magnitude of the second voltage applied to the bias electrodes 60a, 60b relative to the first voltage may be small, and may be ineffective at slowing or repelling the faster moving positive ions of the desired species that were generated from the negative ion beam 10. However, this positive voltage difference between the second voltage and the first voltage is sufficient to repel slow moving positive ions, such as positively charged ions created from molecules of the stripper gas or from molecules of the insulating gas.

The second voltage applied to the bias electrodes 60a, 60b may be hundreds or a few thousand volts greater than the first voltage. For example, in one embodiment, the first voltage may be 750 kV, while the second voltage may be 140V greater than the first voltage, although the disclosure is not limited to any particular values. In some embodiments, the ratio of the difference between the first and second voltages as compared to the first voltage (i.e. 140V as compared to 750 kV) may be less than 0.1%. In other embodiments, this ratio may be less than 0.05%. In still other embodiments, this ratio may be less than 0.02%. As described above, any second voltage which inhibits the slow moving positive ions created from the stripper gas or the insulating gas, but does not inhibit the passage of fast moving positive ions of the desired species may be used.

In this embodiment, these bias electrodes 60a, 60b are disposed within the terminal 30, proximate the inlet 42 and outlet 43 of the stripper tube 40. They are spaced apart or otherwise insulated from the stripper tube 40 and the terminal 30, as they are maintained at a slightly more positive second voltage. The power supply 80 may be referenced to the terminal 30 and may be a conventional power supply, or may be a battery or other power source.

Figure 2:
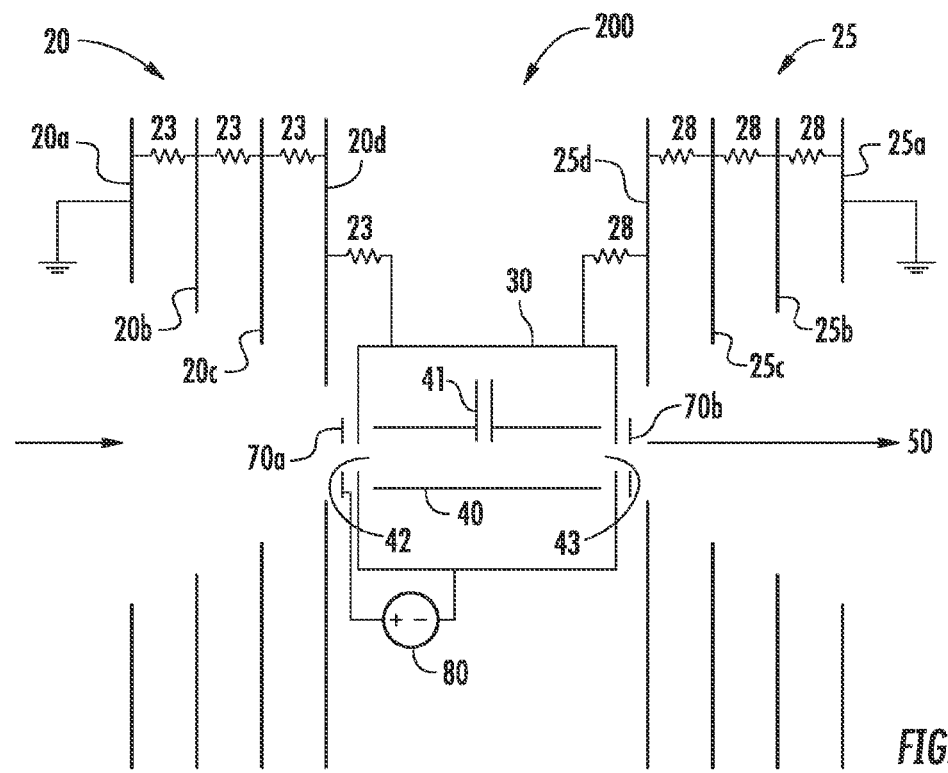
FIG. 2 shows a second embodiment of a tandem accelerator.

FIG. 2 shows a second embodiment of a tandem accelerator 200. In this embodiment, all like components are given identical reference designators and will not be described again. Therefore, FIG. 2 should be construed in relation to the embodiment of FIG. 1. In this embodiment, the bias electrodes 70a, 70b are disposed outside the terminal 30. These bias electrodes 70a, 70b are disposed between the terminal 30 and the innermost input electrode 20d and innermost output electrode 25d, respectively. The bias electrodes 70a, 70b are biased at a second voltage, greater than the first voltage of the terminal 30, such as by a power supply 80. The bias electrodes 70a, 70b are separated or otherwise insulated from the innermost input electrode 20d, the innermost output electrode 25d and the terminal 30. As with the previous embodiment, the bias electrode 70a is disposed between the innermost input electrode 20d and the inlet 42 of the stripper tube 40. The bias electrode 70b is disposed between the innermost output electrode 25d and the outlet 43 of the stripper tube 40.

Figure 3:
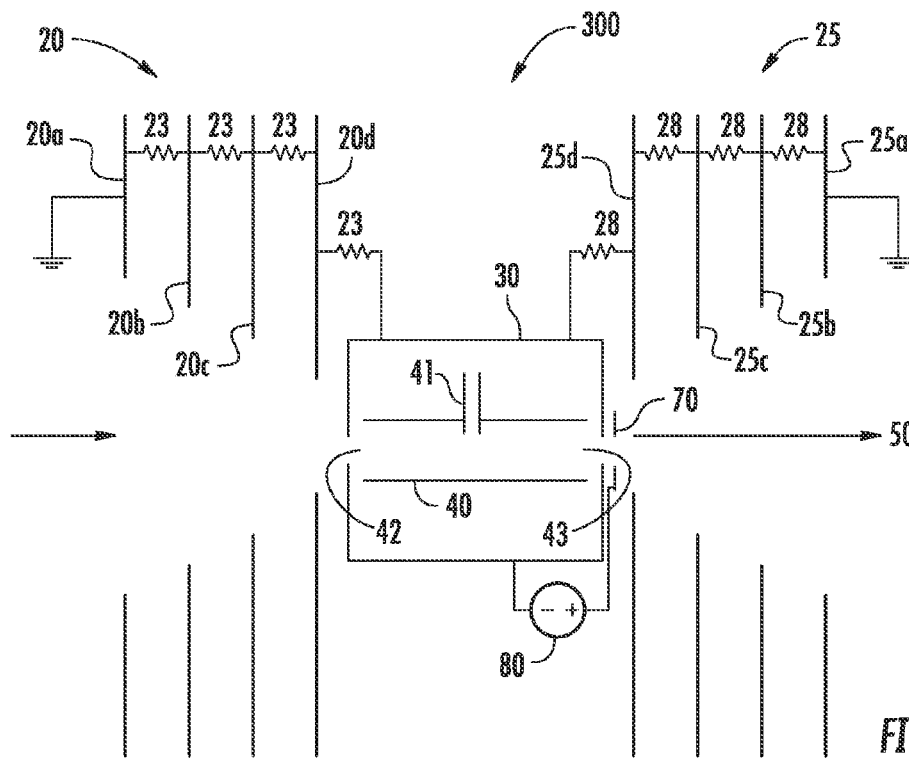
FIG. 3 shows a third embodiment of a tandem accelerator.

FIG. 3 shows another embodiment of a tandem accelerator 300. This tandem accelerator 300 is identical to the tandem accelerator 200 of FIG. 2, except only a single bias electrode 70 is disposed on the outlet side of the terminal 30. Because it may be the passage of undesired ions through the output electrodes 25 that leads to decreased yield and quality, in some embodiments, the bias electrode on the inlet side of the terminal 30 may be removed. It should be noted that the embodiment of FIG. 1 may also be modified to include a bias electrode 60b only on the outlet side of the terminal 30, if desired.

The embodiments of FIGS. 1-3 all include a tandem accelerator having a plurality of input electrodes 20, biased at progressively more positive voltages, a plurality of output electrodes 25 biased at progressively less positive voltages, and a terminal 30, biased at a first voltage, disposed therebetween. In each embodiment, a stripper tube 40 is disposed in the terminal 30 and a first bias electrode is disposed between the outlet 43 of the stripper tube 40 and the innermost output electrode 25d. In some embodiments, the first bias electrode is disposed within the terminal 30 (see FIG. 1), while in other embodiments, the first bias electrode is disposed outside the terminal 30 (see FIGS. 2-3). The first bias electrode is biased at a second voltage, which is more positive than the first voltage applied to the terminal 30 to repel slow moving positive ions back into the stripper tube 40.

In some embodiments, a second bias electrode is disposed between the inlet 42 of the stripper tube 40 and the innermost input electrode 20d. In some embodiments, the second bias electrode is disposed within the terminal 30 (see FIG. 1), while in other embodiments, the second bias electrode is disposed outside the terminal 30 (see FIG. 2). The second bias electrode may also be biased at a second voltage, which is more positive than the first voltage applied to the terminal 30 to repel slow moving positive ions back into the stripper tube 40.

Figure 4:
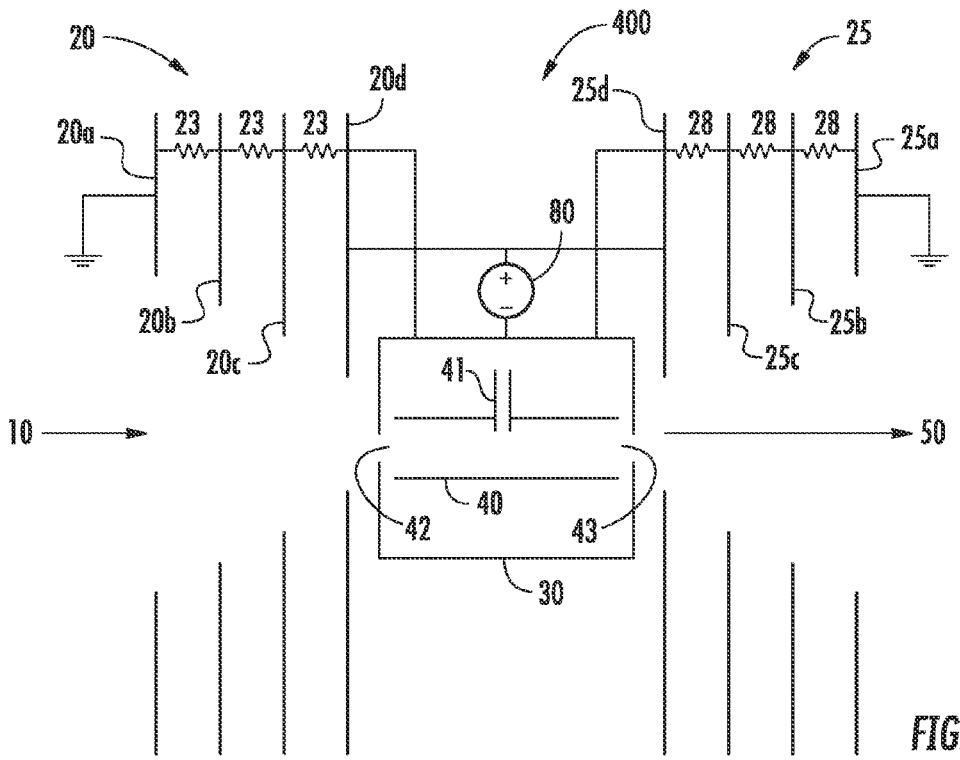
FIG. 4 shows a fourth embodiment of a tandem accelerator.

FIG. 4 shows another embodiment. In this embodiment, the tandem accelerator 400 does not include separate bias electrodes, as were shown in FIGS. 1-3. Rather, the innermost output electrode 25d is biased at a second voltage, which is more positive than the first voltage applied to the terminal 30, such as by using power supply 80. In this way, the innermost output electrode 25d performs the same function as the first bias electrode of the previous embodiments. In some embodiments, the innermost input electrode 20d may be similarly biased at a more positive voltage than the terminal 30. In other embodiments, the innermost input electrode 20d may be coupled to the terminal 30 through a resistor 23 (see FIG. 3).

The embodiment shown in FIG. 4 may be created by coupling the innermost output electrode 25d and the innermost input electrode 20d to the output of the power supply 80, rather than the terminal 30, as was done in the previous embodiments.

In the embodiment shown in FIG. 4, the second output electrode 25c is electrically coupled to the terminal 30 through a resistor 28. Similarly, the third input electrode 20c is electrically coupled to the terminal 30 through a resistor 28.

In another embodiment, the second output electrode 25c may be electrically coupled to the innermost output electrode 25d, such as through a resistor. This resistor may be a different value than the value of resistors 28 used to couple the other output electrodes (i.e. third output electrode 25*b*, and outermost output electrode 25*a*). In other embodiment, this resistor may be the same value. In these embodiments, although innermost output electrode 25*d* is at a second voltage, which is greater that the first voltage applied to the terminal 30, the second output electrode 25*c*, the third output electrode 25*b*, and the outermost output electrode 25*a* are each at less positive voltages than the terminal 30.

The innermost output electrode 25*d* and optionally the innermost input electrode 20*d* then serve to repel slow moving positive ions back toward the terminal 30. Thus, in this embodiment, the tandem accelerator 400 comprises plurality of input electrodes 20, biased at progressively more positive voltages, a plurality of output electrodes 25 biased at progressively less positive voltages, and a terminal 30, biased at a first voltage, disposed therebetween. A stripper tube 40 is disposed in the terminal 30. In this embodiment, at least the innermost output electrode 25*d* is biased at a second voltage that is more positive than the first voltage.

Thus, like the previous embodiments, this embodiment includes an innermost output electrode 25*d* disposed proximate the outlet 43 of the stripper tube 40, which is biased at a second voltage, which is more positive than the first voltage applied to the terminal 30. Additionally, in some embodiments, an innermost input electrode 20*d* is disposed proximate the inlet of the stripper tube 40 and is also biased at the second voltage.

Figure 5:
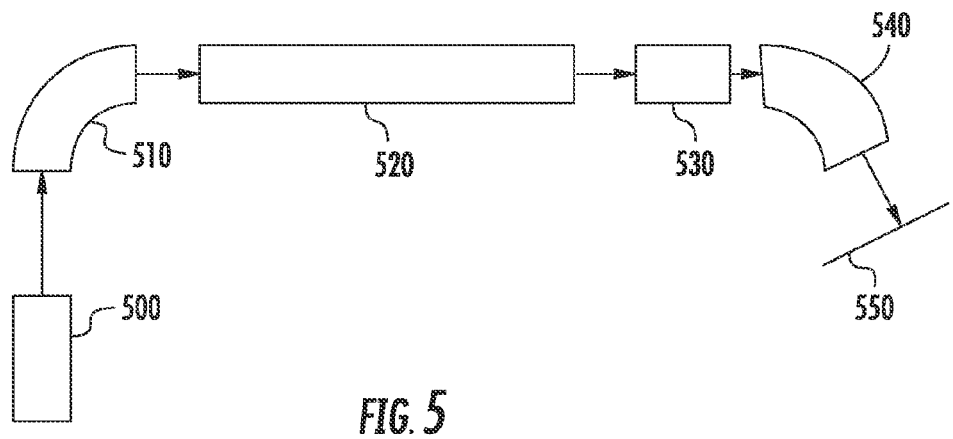
FIG. 5 shows an ion implantation system using the tandem accelerator according to any of the previous embodiments.

Any of the tandem accelerators described herein may be used as a component in an ion implantation system. FIG. 5 shows a representative ion implantation system that includes a tandem accelerator according to any of the previous embodiments.

The ion implantation system comprises a negative ion beam source 500, which is used to generate a negative ion beam. As described above, this may be a traditional ion source, used to generate a positive ion beam, where a Mg exchange cell is coupled to the output of the ion source. The output of the negative ion beam source 500 may be directed toward a mass analyzer 510, which only allows the passage of certain species of ions. The ions that exit the mass analyzer 510 are directed toward the tandem accelerator 520 where it is accelerated by the set of input electrodes toward a terminal. This tandem accelerator 520 may be any of those embodiments described in FIGS. 1-4. In each of these embodiments, electrons are stripped away from the negative ion beam in the stripper tube, which is disposed within the terminal, and a positive ion beam is accelerated out of the tandem accelerator 520 by the output electrodes. The positive ion beam may then be directed toward a filter 530, which allows passage of ions of only a certain charge. In other embodiments, the filter may not be employed. The output of the filter 530 may pass through a scanner and collimator 540, which serve to create the final ion beam containing the desired species of ions. The output of the scanner and collimator is then directed toward a workpiece 550.

The tandem accelerator and ion implantation system described herein may reduce the number of unwanted ions that exit the tandem accelerator. As described above, unwanted positive ions, which are formed from the stripper gas or the insulating gas, may contaminate the workpiece or the output electrodes. This may reduce the manufacturing yield of devices being formed such as CMOS image sensors or negatively impact the performance of the tandem accelerator. By introducing bias electrodes at the outlet of the stripper tube, the slower moving ions (typically formed from the stripper gas or the insulating gas) can be repelled and contained within the stripper tube, while the desired ions are accelerated toward the output electrodes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A tandem accelerator, comprising:
   a plurality of input electrodes;
   a plurality of output electrodes;
   a terminal, disposed between an innermost electrode of the plurality of input electrodes and an innermost electrode of the plurality of output electrodes, the terminal biased at a first voltage;
   a stripper tube disposed in the terminal, having an inlet proximate the plurality of input electrodes, an outlet proximate the plurality of output electrodes, and an injection conduit for introduction of a stripper gas; and
   a first bias electrode disposed between the outlet of the stripper tube and the innermost electrode of the plurality of output electrodes, the first bias electrode biased at a second voltage, more positive than the first voltage.

2. The tandem accelerator of claim 1, wherein the first bias electrode is disposed within the terminal.

3. The tandem accelerator of claim 1, wherein the first bias electrode is disposed outside of the terminal.

4. The tandem accelerator of claim 1, wherein an outermost electrode of the plurality of input electrodes is grounded, and each adjacent input electrode is more positively biased than a previous input electrode with the innermost electrode of the plurality of input electrodes being most positively biased, and wherein an outermost electrode of the plurality of output electrodes is grounded, and each adjacent output electrode is less positively biased than a next output electrode with the innermost electrode of the plurality of output electrodes being the most positively biased.

5. The tandem accelerator of claim 4, wherein each of the plurality of input electrodes is coupled to an adjacent input electrode via a resistor, and the innermost electrode of the plurality of input electrodes is coupled to the terminal, and wherein each of the plurality of output electrodes is coupled to an adjacent output electrode via a resistor, and the innermost electrode of the plurality of output electrodes is coupled to the terminal.

6. The tandem accelerator of claim 1, further comprising a power supply to supply the second voltage to the first bias electrode.

7. The tandem accelerator of claim 6, wherein the power supply is referenced to the terminal.

8. The tandem accelerator of claim 1, wherein the second voltage is 100-2000 volts greater than the first voltage.

9. The tandem accelerator of claim 1, further comprising a second bias electrode disposed between the inlet of the stripper tube and the innermost electrode of the plurality of input electrodes, and biased at the second voltage.

10. A tandem accelerator, comprising:
a plurality of input electrodes;
a plurality of output electrodes;
a terminal, disposed between an innermost electrode of the plurality of input electrodes and an innermost electrode of the plurality of output electrodes, the terminal biased at a first voltage; and
a stripper tube disposed in the terminal, having an inlet proximate the plurality of input electrodes, an outlet proximate the plurality of output electrodes, and an injection conduit for introduction of a stripper gas;
wherein the innermost electrode of the plurality of output electrodes is biased at a second voltage, more positive than the first voltage.

11. The tandem accelerator of claim 10, wherein the innermost electrode of the plurality of input electrodes is biased at the second voltage.

12. The tandem accelerator of claim 11, wherein an outermost electrode of the plurality of input electrodes is grounded, and each adjacent input electrode is more positively biased than a previous input electrode with the innermost electrode of the plurality of input electrodes being the most positively biased, and wherein an outermost electrode of the plurality of output electrodes is grounded, and each adjacent output electrode is less positively biased than a next output electrode with the innermost electrode of the plurality of output electrodes being the most positively biased.

13. The tandem accelerator of claim 12, further comprising a power supply supplying the second voltage, wherein each of the plurality of input electrodes is coupled to an adjacent input electrode via a resistor, and the innermost electrode of the plurality of input electrodes is coupled to the power supply, and wherein each of the plurality of output electrodes is coupled to an adjacent output electrode via a resistor, and the innermost electrode of the plurality of output electrodes is coupled to the power supply.

14. The tandem accelerator of claim 10, wherein the second voltage is 100-2000 volts greater than the first voltage.

15. An ion implantation system, comprising:
a negative ion beam source; and
a tandem accelerator which converts a negative ion beam from the negative ion beam source into a positive ion beam, the tandem accelerator comprising:
a plurality of input electrodes;
a plurality of output electrodes;
a terminal, disposed between an innermost electrode of the plurality of input electrodes and an innermost electrode of the plurality of output electrodes, the terminal biased at a first voltage;
a stripper tube disposed in the terminal, having an inlet proximate the plurality of input electrodes, an outlet proximate the plurality of output electrodes, and an injection conduit for introduction of a stripper gas; and
a first bias electrode disposed between the outlet of the stripper tube and the innermost electrode of the plurality of output electrodes, the first bias electrode biased at a second voltage, more positive than the first voltage.

16. The ion implantation system of claim 15, further comprising a mass analyzer disposed between the negative ion beam source and the tandem accelerator.

17. The ion implantation system of claim 15, further comprising a scanner and collimator disposed at an output of the tandem accelerator, wherein the output of the scanner and collimator is directed toward a workpiece.

* * * * *